United States Patent
Tay et al.

(10) Patent No.: US 9,202,777 B2
(45) Date of Patent: Dec. 1, 2015

(54) SEMICONDUCTOR PACKAGE SYSTEM WITH CUT MULTIPLE LEAD PADS

(75) Inventors: Lionel Chien Hui Tay, Singapore (SG); Seng Guan Chow, Singapore (SG); Zigmund Ramirez Camacho, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 774 days.

(21) Appl. No.: 12/131,037

(22) Filed: May 30, 2008

(65) Prior Publication Data
US 2009/0294935 A1    Dec. 3, 2009

(51) Int. Cl.
| H01L 21/48 | (2006.01) |
| H01L 23/495 | (2006.01) |
| H01L 23/31 | (2006.01) |
| H01L 23/00 | (2006.01) |

(52) U.S. Cl.
CPC ....... *H01L 23/49541* (2013.01); *H01L 23/3107* (2013.01); *H01L 24/48* (2013.01); *H01L 2224/32245* (2013.01); *H01L 2224/48091* (2013.01); *H01L 2224/48247* (2013.01); *H01L 2224/73265* (2013.01); *H01L 2924/19041* (2013.01)

(58) Field of Classification Search
CPC ............ H01L 21/4821; H01L 21/4832; H01L 21/4846
See application file for complete search history.

(56) References Cited

U.S. PATENT DOCUMENTS

| | | | |
|---|---|---|---|
| 6,348,726 B1 | 2/2002 | Bayan et al. | |
| 6,818,973 B1 | 11/2004 | Foster | |
| 6,838,751 B2 | 1/2005 | Cheng et al. | |
| 6,876,068 B1 | 4/2005 | Lee et al. | |
| 6,927,483 B1* | 8/2005 | Lee et al. | 257/676 |
| 7,211,471 B1 | 5/2007 | Foster | |
| 7,245,007 B1 | 7/2007 | Foster | |
| 7,339,258 B2 | 3/2008 | Punzalan et al. | |
| 2003/0164554 A1* | 9/2003 | Fee et al. | 257/787 |
| 2007/0281392 A1* | 12/2007 | Yee et al. | 438/111 |
| 2008/0135995 A1* | 6/2008 | Li et al. | 257/676 |
| 2008/0224277 A1* | 9/2008 | Qiao et al. | 257/666 |
| 2008/0283980 A1* | 11/2008 | Gao et al. | 257/670 |

* cited by examiner

*Primary Examiner* — Jae Lee
(74) *Attorney, Agent, or Firm* — Ishimaru & Associates LLP (57) ABSTRACT

A semiconductor package system includes: providing a leadframe having inner frame bars, outer frame bars, a die pad, tiebars, and rows of leads, the inner frame bars being coplanar with outer frame bars; attaching a semiconductor chip to the die pad; attaching bond wires between the semiconductor chip and the rows of leads; encapsulating the semiconductor chip, the bond wires, the inner frame bars, the outer frame bars, the die pad, the tiebars, and the rows of leads in an encapsulant; cutting a groove to remove the inner frame bars; and singulating the leadframe and the encapsulant to remove the outer frame bars.

6 Claims, 11 Drawing Sheets

FIG. 22

SEMICONDUCTOR PACKAGE SYSTEM WITH CUT MULTIPLE LEAD PADS

TECHNICAL FIELD

The present invention relates generally to semiconductor packages, and more particularly to a system for a semiconductor package having a leadframe with multiple rows of leads.

BACKGROUND ART

In the electronics industry, the tendency has been to reduce the size of electronic devices such as camcorders and portable telephones while increasing performance and speed. Integrated circuit packages for complex systems typically are comprised of a multiplicity of interconnected integrated circuit chips. The integrated circuit chips usually are made from a semiconductor material such as silicon or gallium arsenide. The integrated circuit chips may be mounted in packages that are then mounted on printed wiring boards.

Packages including integrated circuit chips typically have numerous external pins that are mechanically attached by solder or a variety of other known techniques to conductor patterns on the printed wiring board.

Typically, the packages on which these integrated semiconductor chips are mounted include a substrate or other chip-mounting device. One example of such a substrate is a leadframe. Leadframes also typically include at least an area on which an integrated circuit chip is mounted and a plurality of power, ground, and/or signal leads to which power, ground, and/or signal sites of the integrated semiconductor chip are electronically attached. Semiconductor integrated chips may be attached to the leadframe using adhesive or any other techniques for attaching such chips to a leadframe which are commonly known to those skilled in the art, such as soldering. The power, ground and signal sites on the chip may then be electrically connected to individual leads of the leadframe.

Leadframes have been used extensively in the integrated circuit packaging industry mainly because of their low manufacturing cost and high reliability. Leadframe packages remain a cost-effective solution for packaging integrated circuits and in recent years certain variations of leadframes such as leadless packages also emerge as improvements.

Typical leadframe packages include a die attach paddle, or pad, surrounded by a number of leads. The leads are temporarily attached to the die attach paddle. An integrated circuit chip, is attached to the die attach paddle using a conductive adhesive such as silver epoxy. The conductive adhesive is cured after die attach. After the die is attached to the die paddle, a wire-bonding process is used to make electrical interconnections between the integrated circuit and the leads of the leadframe. After wire bonding, the leadframe with the integrated circuit attached is encapsulated using a molding compound.

Such enclosures may include encapsulant in a plastic or a multi-part housing made of plastic ceramic, or metal. The enclosure protects the leadframe and the attached chip from physical, electrical, and/or chemical damage. Finally, post mold curing and singulation steps are conducted to complete the packaging process.

The leadframe and attached chip(s) may then be mounted on, for example, a circuit board, or card along with other leadframes or devices. The circuit board or card may then be incorporated into a wide variety of devices such as computers, automobiles, and appliances, among others.

As integrated circuits have become smaller with increased performance capabilities leadframes for integrated circuits have been adapted to accommodate these integrated circuits. A multi row leadframe has found increased use to provide additional leads on a leadframe of a given size. The multi row leadframe includes an outer row of leads and one or several inner rows of leads surrounding a die pad to which the integrated circuit die is attached. The contact pads on the integrated circuit are connected to the inner and the outer rows of leads with bonding wires in accordance with the particular design of the semiconductor package.

One problem that persists with multi row leadframes is that separation of the leads from the leadframe so as to electrically insulate each contact from each other is complex and cumbersome. Such complexity of the separation process also adds risk to the reliability of the resulting chip packages.

Another problem with multi row leadframes is that the die pad must be in a different plane from the plane on which the outer row leads are placed. This non-planar nature of previous leadframes is to prevent the cutting of the outer row leads during the process of separating the inner row leads from the leadframe and it adds additional complexity to the leadframe design as well as to the separation process.

Thus, a need still remains for reducing the complexity of the leadframe design and the separation process. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a semiconductor package system including: providing a leadframe having inner frame bars, outer frame bars, a die pad, tiebars, and rows of leads, the inner frame bars being coplanar with the outer frame bars; attaching a semiconductor chip to the die pad; attaching bond wires between the semiconductor chip and the rows of leads; encapsulating the semiconductor chip, the bond wires, the inner frame bars, the outer frame bars, the die pad, the tiebars, and the rows of leads in an encapsulant; cutting grooves to remove the inner frame bars; and singulating the leadframe and the encapsulant to remove the outer frame bars.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. Likewise, the drawings showing embodiments of the system are semi-diagrammatic and not to scale and, particularly, some of the dimensions are for the clarity of presentation and are shown exaggerated in the drawings. Also, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the leadframe, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "system" as used herein refers to and is defined as the method and as the apparatus of the present invention in accordance with the context in which the term is used.

The term "coplanar" is defined as being in the same plane or flat. With regard to an unfinished leadframe the term means that the unfinished leadframe is in one plane and flat as contrasted with having different heights.

Figure 1:
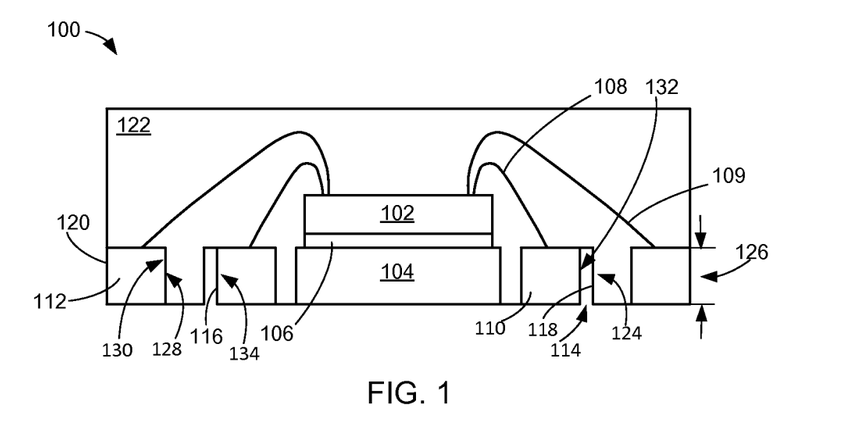
FIG. 1 shows a cross-sectional view of a first embodiment of the present invention after a stage of singulation.

Referring now to FIG. 1, therein is shown a cross-sectional view of a first embodiment of the present invention after a stage of singulation. A finished leadframe 100 is shown. A semiconductor chip 102 is bonded to a die pad 104 with a bonding material 106. The bonding material 106 could be of the nature of an epoxy material or an adhesive material. The semiconductor chip 102 is connected by a first type bond wire 108 to inner leads 110 and by a second type bond wire 109 to outer leads 112.

A groove 114 is present in between the outer leads 112 and the inner leads 110. The groove 114 is adjacent to the inner leads 110. The groove 114 has a groove inner surface 116 and a groove outer surface 118. The finished leadframe 100 has a leadframe outer surface 120. The finished leadframe 100 is also with encapsulant 122. The groove 114 has a groove depth 124 equal to a lead height 126 of the inner leads 110 and the outer leads 112. The outer leads 112 have outer lead inner surfaces 128 fully embedded in the encapsulant 122. The outer lead inner surfaces 128 have an inner surface height 130 the same as the lead height 126. The inner leads 110 have inner lead outer surfaces 132 fully exposed in the groove 114. The inner lead outer surfaces 132 have an outer surface height 134 the same as the lead height 126. The groove 114 is directly in between the outer lead inner surfaces 128 and the inner lead outer surfaces 132.

Figure 2:
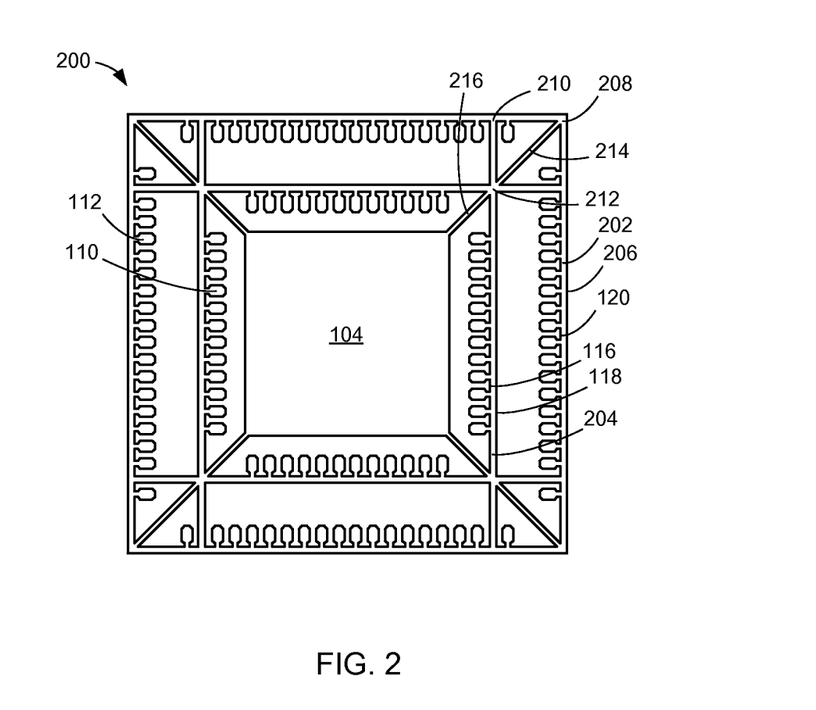
FIG. 2 shows a top view of a leadframe of the structure of FIG. 1 at a beginning stage of the process.

Referring now to FIG. 2, therein is shown a top view of an unfinished leadframe 200 of the structure of FIG. 1 in a beginning stage of the process. The unfinished leadframe 200 has outer frame bars 202. The unfinished leadframe 200 also has inner frame bars 204 located within the opening formed by the outer frame bars 202.

One of the outer frame bars 202 has an inner surface, which will become the leadframe outer surface 120 and an outer frame bar outer surface 206. Two of the outer frame bars 202, which are adjacent, join at an outer frame corner 208. One of the inner frame bars 204 intersects with one of the outer frame bars 202 at an intersection point 210.

The inner frame bars 204 are coplanar with and parallel to the outer frame bars 202, respectively. Two of the inner frame bars 204, which are adjacent, intersect at an inner frame corner 212. One of the inner frame bars 204 has an inner surface, which will become the groove inner surface 116 and an outer surface, which will become the groove outer surface 118.

An outer tiebar 214 connects the outer frame corner 208 and the inner frame corner 212. The outer tiebar 214 is half-etched. The die pad 104 lies within the opening formed by the inner frame bars 204. An inner tiebar 216 connects the inner frame corner 212 to a corner of the die pad 104. The inner tiebar 216 is half-etched.

The outer leads 112 are attached to the outer frame bars 202. The inner leads 110 are attached to the inner frame bars 204.

In this embodiment, both the inner leads 110 and the outer leads 112 point inward towards the die pad 104 in an encapsulant 218. In other embodiments, the orientation of the inner leads 110 or the outer leads 112 could be pointing outwards.

Figure 3:
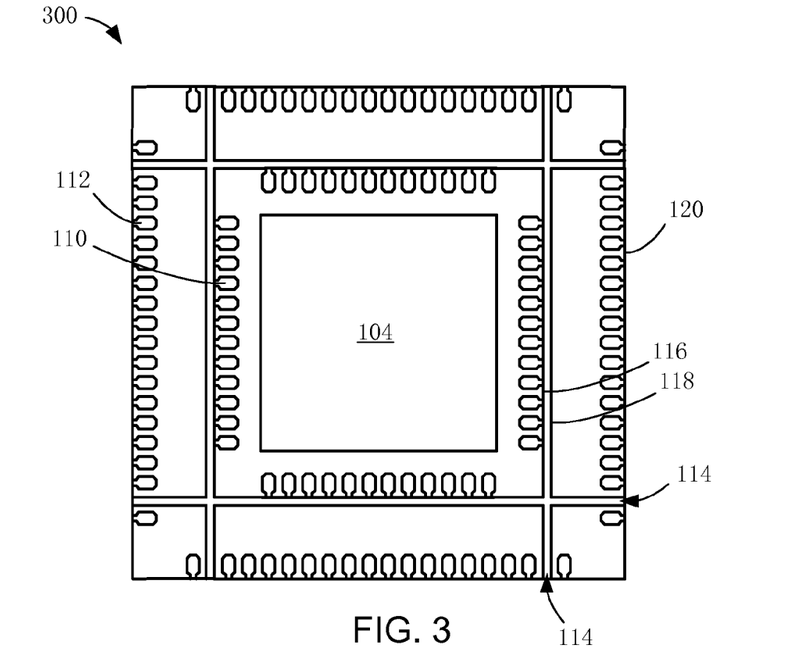
FIG. 3 shows a bottom view of the structure of FIG. 1.

Referring now to FIG. 3, therein is shown a bottom view of the finished leadframe 100 of FIG. 1. The groove 114 is cut to eliminate the inner frame bars 204 and to expose the groove inner surface 116 and the groove outer surface 118. The elimination of the inner frame bars 204 electrically isolates the inner leads 110.

The singulation process eliminates the outer frame bars 202 and exposes the leadframe outer surface 120. The elimination of the outer frame bars 202 electrically isolates the outer leads 112.

The die pad 104, the inner tiebars 216, and the outer tiebars 214 are coplanar along with the inner leads 110 and the outer leads 112. The die pad 104, the inner leads 110, and the outer leads 112 are exposed by the encapsulant 122 because these structures are flat. The inner tiebars 216 and the outer tiebars 214 are not exposed because they are half-etched. Although the die pad, tiebars, and leads are flat in the various embodiments, a process such as etching in some locations may undercut small portions of these structures to better hold the encapsulant to these structures. However, substantial portions of the tops of the die pad, tiebars, and leads are coplanar in the various embodiments.

Figure 4:
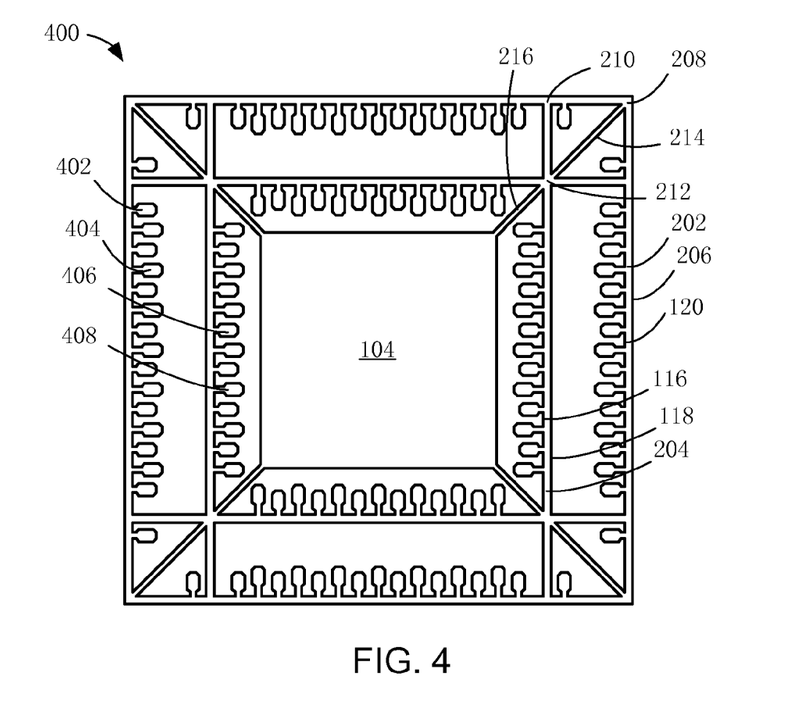
FIG. 4 shows a top view of an unfinished leadframe of a second embodiment of the present invention with staggered leads at a beginning stage of the process.

Referring now to FIG. 4, therein is shown a top view of an unfinished leadframe 400 of a second embodiment of the present invention in a beginning stage of the process. The unfinished leadframe 400 has the outer frame bars 202. The unfinished leadframe 400 also has the inner frame bars 204 located within the opening formed by the outer frame bars 202.

One of the outer frame bars 202 has an inner surface, which will become the leadframe outer surface 120 and also has the outer frame bar outer surface 206. Two of the outer frame bars 202, which are adjacent, join at the outer frame corner 208. One of the inner frame bars 204 intersects with one of the outer frame bars 202 at the intersection point 210.

The inner frame bars 204 are coplanar with and parallel to the outer frame bars 202, respectively. Two of the inner frame bars 204, which are adjacent, intersect at the inner frame corner 212. One of the inner frame bars 204 has an inner surface, which will become the groove inner surface 116 and an outer surface, which will become the groove outer surface 118.

The outer tiebar 214 connects the outer frame corner 208 and the inner frame corner 212. The outer tiebar 214 is half-etched. The die pad 104 lies within the opening formed by the inner frame bars 204. The inner tiebar 216 connects the inner frame corner 212 to a corner of the die pad 104. The inner tiebar 216 is half-etched.

First type outer leads 402 are attached to the outer frame bars 202. Second type outer leads 404 are also attached to the outer frame bars 202. The first type outer leads 402 and the second type outer leads 404 occupy staggered positions along the outer frame bars 202.

First type inner leads 406 are attached to the inner frame bars 204. Second type inner leads 408 are also attached to the inner frame bars 204. The first type inner leads 406 and the second type inner leads 408 occupy staggered positions along the inner frame bars 204.

In this embodiment, both the first type outer leads 402 and the second type outer leads 404, as well as both the first type inner leads 406 and the second type inner leads 408 point inward towards the die pad 104 in an encapsulant 410. In other embodiments, the orientations of the first type outer leads 402, the second type outer leads 404, the first type inner leads 406, and the second type inner leads 408 could be pointing outwards.

Figure 5:
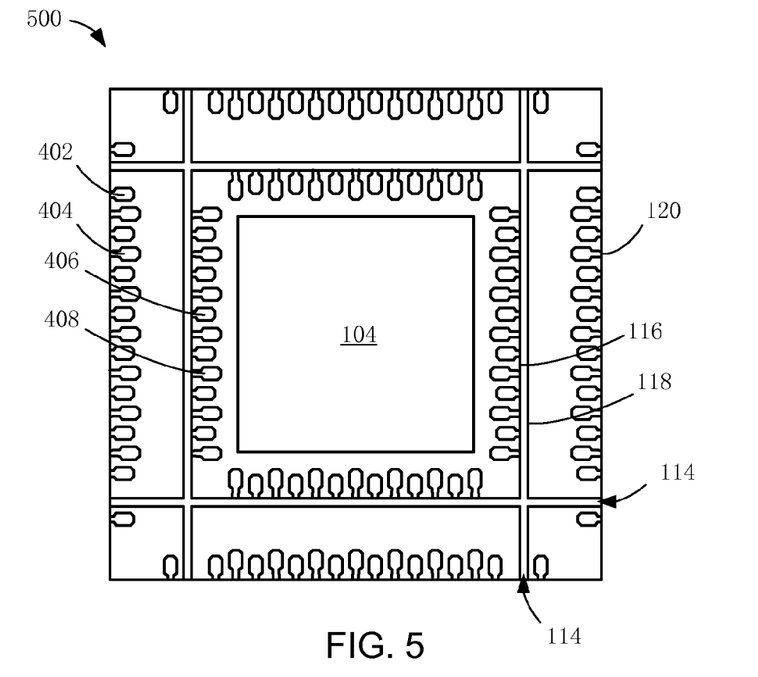
FIG. 5 shows a bottom view of the second embodiment of the present invention after a stage of singulation.

Referring now to FIG. 5, therein is shown a bottom view of a finished leadframe 500 of FIG. 4 after a stage of singulation. The groove 114 is cut to eliminate the inner frame bars 204 and to expose the groove inner surface 116 and the groove outer surface 118 in an encapsulant 502.

The elimination of the inner frame bars 204 electrically isolates both the first type inner leads 406 and the second type inner leads 408. The singulation process eliminates the outer frame bars 202 and exposes the leadframe outer surface 120. The elimination of the outer frame bars 202 electrically isolates both the first type outer leads 402 and the second type outer leads 404.

Figure 6:
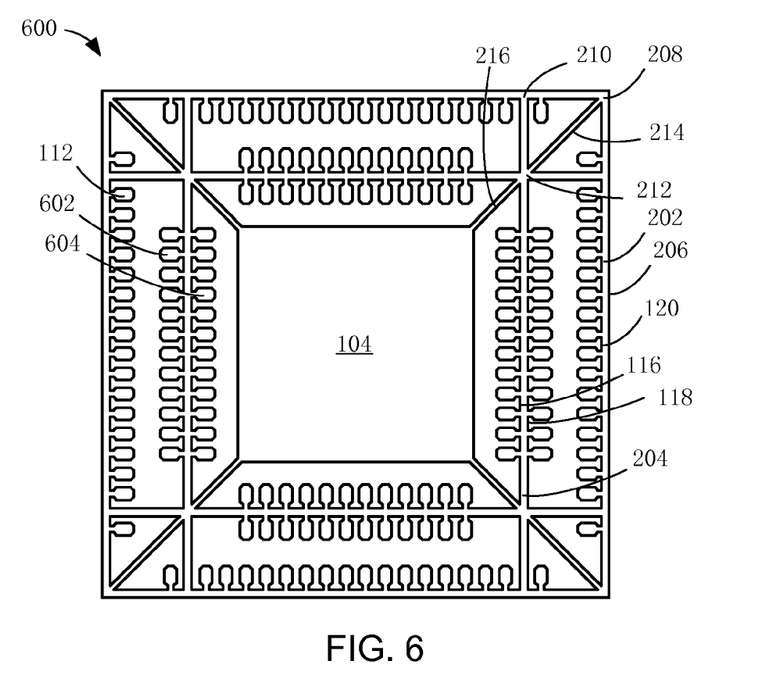
FIG. 6 shows the top view of an unfinished leadframe of a third embodiment of the present invention with back-to-back leads at a beginning stage of the process.

Referring now to FIG. 6, therein is shown a top view of an unfinished leadframe 600 of a third embodiment of the present invention in a beginning stage of the process. The unfinished leadframe 600 has the outer frame bars 202. The unfinished leadframe 600 also has the inner frame bars 204 located within the opening formed by the outer frame bars 202.

One of the outer frame bars 202 has an inner surface, which will become the leadframe outer surface 120 and also has the outer frame bar outer surface 206. Two of the outer frame bars 202, which are adjacent, join at the outer frame corner 208. One of the inner frame bars 204 intersects with one of the outer frame bars 202 at the intersection point 210.

The inner frame bars 204 are coplanar with and parallel to the outer frame bars 202, respectively. Two of the inner frame bars 204, which are adjacent, intersect at the inner frame corner 212. One of the inner frame bars 204 has an inner surface, which will become the groove inner surface 116 and an outer surface, which will become the groove outer surface 118.

The outer tiebar 214 connects the outer frame corner 208 and the inner frame corner 212. The outer tiebar 214 is half-etched. The die pad 104 lies within the opening formed by the inner frame bars 204. The inner tiebar 216 connects the inner frame corner 212 to a corner of the die pad 104. The inner tiebar 216 is half-etched.

The outer leads 112 are attached to the outer frame bars 202.

First type inner leads 602 are attached to the inner frame bars 204. Second type inner leads 604 are also attached to the inner frame bars 204. The first type inner leads 602 and the second type inner leads 604 are in back-to-back positions along the inner frame bars 204.

In this embodiment, the outer leads 112 point inward towards the die pad 104 in an encapsulant 606. In other embodiments, the orientations of the outer leads 112 could be pointing outwards.

Figure 7:
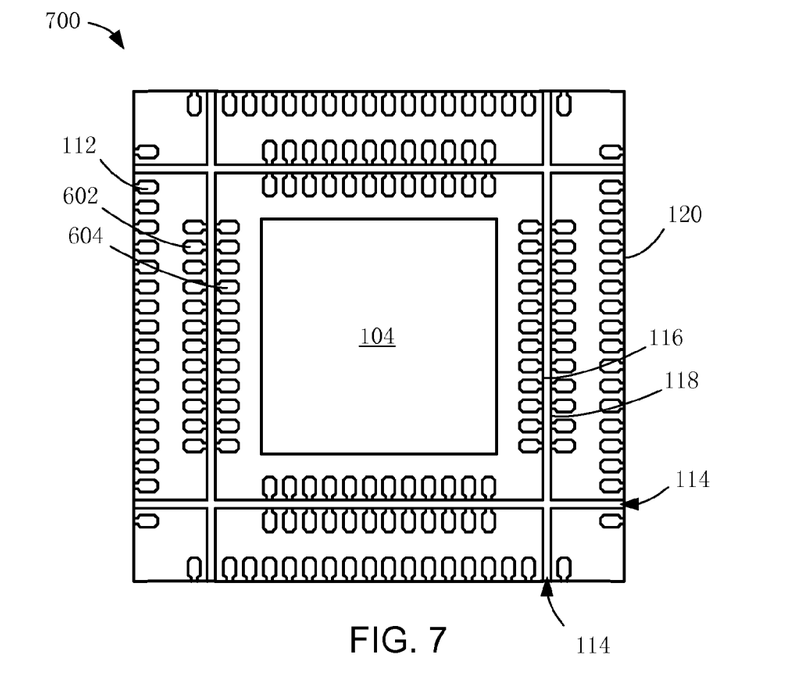
FIG. 7 shows a bottom view of a third embodiment of the present invention after a stage of singulation.

Referring now to FIG. 7, therein is shown a bottom view of a finished leadframe 700 of FIG. 6 after a stage of singulation. The groove 114 is cut to eliminate the inner frame bars 204 and to expose the groove inner surface 116 and the groove outer surface 118 in an encapsulant 702.

The elimination of the inner frame bars 204 electrically isolates both the first type inner leads 602 and the second type inner leads 604. The singulation process eliminates the outer frame bars 202 and exposes the leadframe outer surface 120. The elimination of the outer frame bars 202 electrically isolates the outer leads 112.

Figure 8:
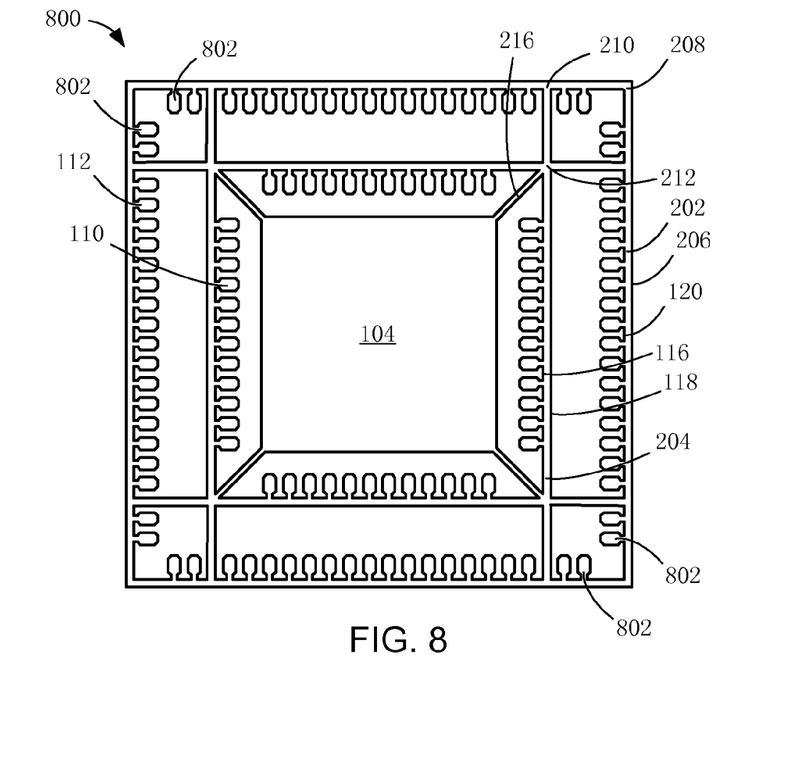
FIG. 8 shows a top view of an unfinished leadframe of a fourth embodiment of the present invention with four additional leads at a beginning stage of the process.

Referring now to FIG. 8, therein is shown a top view of an unfinished leadframe 800 of a fourth embodiment of the present invention in a beginning stage of the process. The unfinished leadframe 800 has the outer frame bars 202. The unfinished leadframe 800 also has the inner frame bars 204 located within the opening formed by the outer frame bars 202.

One of the outer frame bars 202 has an inner surface, which will become the leadframe outer surface 120 and also has the outer frame bar outer surface 206. Two of the outer frame bars 202, which are adjacent, join at the outer frame corner 208. One of the inner frame bars 204 intersects with one of the outer frame bars 202 at the intersection point 210.

The inner frame bars 204 are coplanar with and parallel to the outer frame bars 202, respectively. Two of the inner frame bars 204, which are adjacent, intersect at the inner frame corner 212. One of the inner frame bars 204 has an inner surface, which will become the groove inner surface 116 and an outer surface, which will become the groove outer surface 118.

The die pad 104 lies within the opening formed by the inner frame bars 204. The inner tiebar 216 connects the inner frame corner 212 to a corner of the die pad 104. The inner tiebar 216 is half-etched. The outer tiebar 214 is absent in this embodiment of the present invention, compared to the first embodiment of the present invention.

The outer leads 112 are attached to the outer frame bars 202. The inner leads 110 are attached to the inner frame bars 204. An extra outer lead 802 is also attached to the outer frame bar 202 between the outer frame corner 208 and the intersection point 210. The extra outer lead 802 is made possible due to the absence of the outer tiebar 214 in this embodiment of the present invention. Eight extra outer leads are present in this embodiment.

In this embodiment, both the inner leads 110, the outer leads 112, and the extra outer lead 802 point inward towards the die pad 104 in an encapsulant 804. In other embodiments, the orientation of the inner leads 110, the outer leads 112, or the extra outer lead 802 could be pointing outwards.

Figure 9:
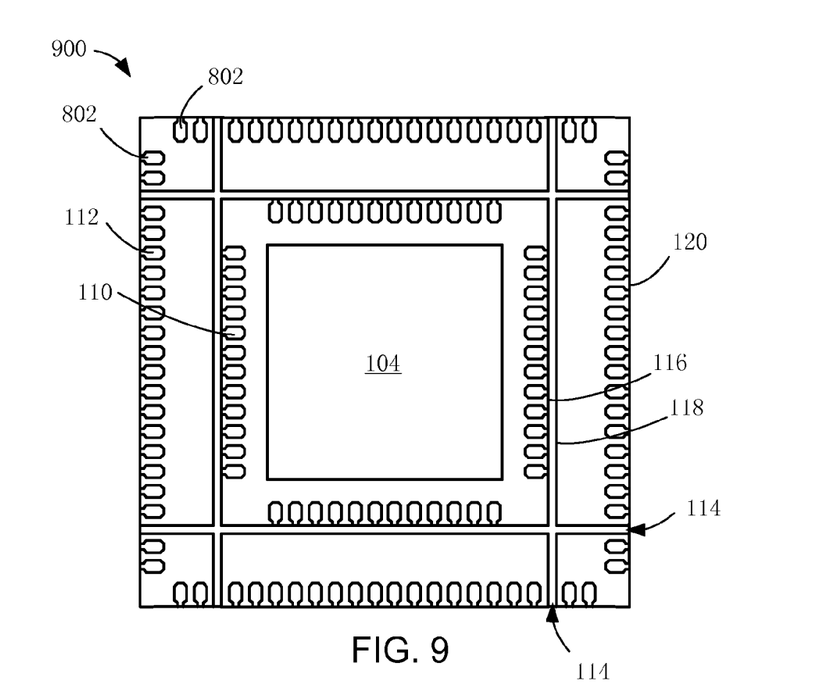
FIG. 9 shows a bottom view of the fourth embodiment of the present invention after a stage of singulation.

Referring now to FIG. 9, therein is shown a bottom view of a finished leadframe 900 of FIG. 8 after a stage of singulation. The groove 114 is cut to eliminate the inner frame bars 204 and to expose the groove inner surface 116 and the groove outer surface 118 in an encapsulant 902. The elimination of the inner frame bars 204 electrically isolates the inner leads 110.

The singulation process eliminates the outer frame bars 202 and exposes the leadframe outer surface 120. The elimination of the outer frame bars 202 electrically isolates the outer leads 112 and the extra outer lead 802.

Figure 10:
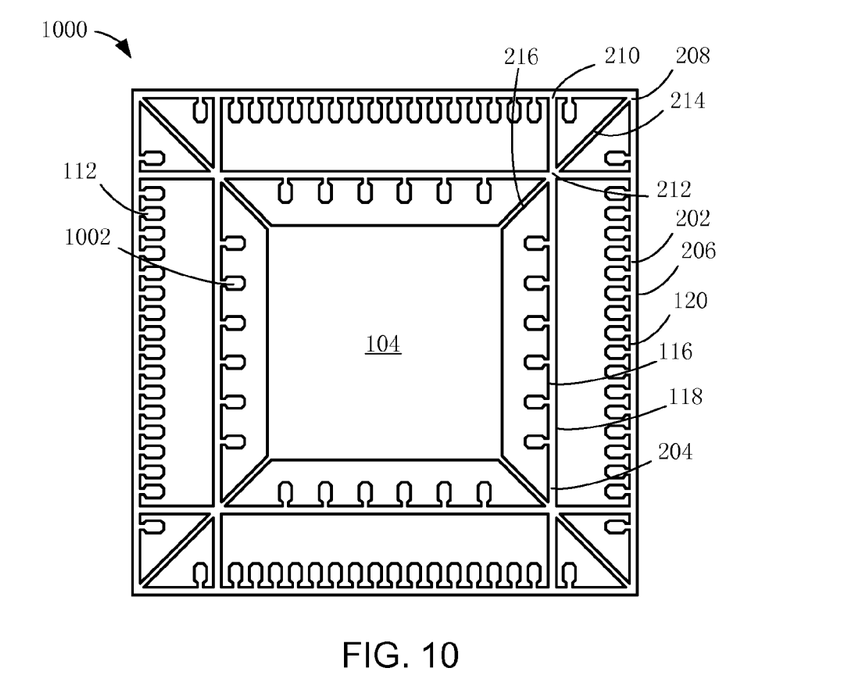
FIG. 10 shows a top view of an unfinished leadframe of a fifth embodiment of the present invention with leads of different pitches at a beginning stage of the process.

Referring now to FIG. 10, therein is shown a top view of an unfinished leadframe 1000 of a fifth embodiment of the present invention in a beginning stage of the process. The unfinished leadframe 1000 has the outer frame bars 202. The unfinished leadframe 1000 also has the inner frame bars 204 located within the opening formed by the outer frame bars 202.

One of the outer frame bars 202 has an inner surface, which will become the leadframe outer surface 120 and also has the outer frame bar outer surface 206. Two of the outer frame bars 202, which are adjacent, join at the outer frame corner 208. One of the inner frame bars 204 intersects with one of the outer frame bars 202 at the intersection point 210.

The inner frame bars 204 are coplanar with and parallel to the outer frame bars 202, respectively. Two of the inner frame bars 204, which are adjacent, intersect at the inner frame corner 212. One of the inner frame bars 204 has an inner surface, which will become the groove inner surface 116 and an outer surface, which will become the groove outer surface 118.

The outer tiebar 214 connects the outer frame corner 208 and the inner frame corner 212. The outer tiebar 214 is half-etched. The die pad 104 lies within the opening formed by the inner frame bars 204. The inner tiebar 216 connects the inner frame corner 212 to a corner of the die pad 104. The inner tiebar 216 is half-etched.

The outer leads 112 are attached to the outer frame bars 202. Inner leads 1002 are attached to the inner frame bars 204. The outer leads 112 and the inner leads 1002 are spaced, respectively, with different pitches.

In this embodiment, both the inner leads 1002 and the outer leads 112 point inward towards the die pad 104 in an encapsulant 1004. In other embodiments, the orientation of the inner leads 1002 or the outer leads 112 could be pointing outwards.

Figure 11:
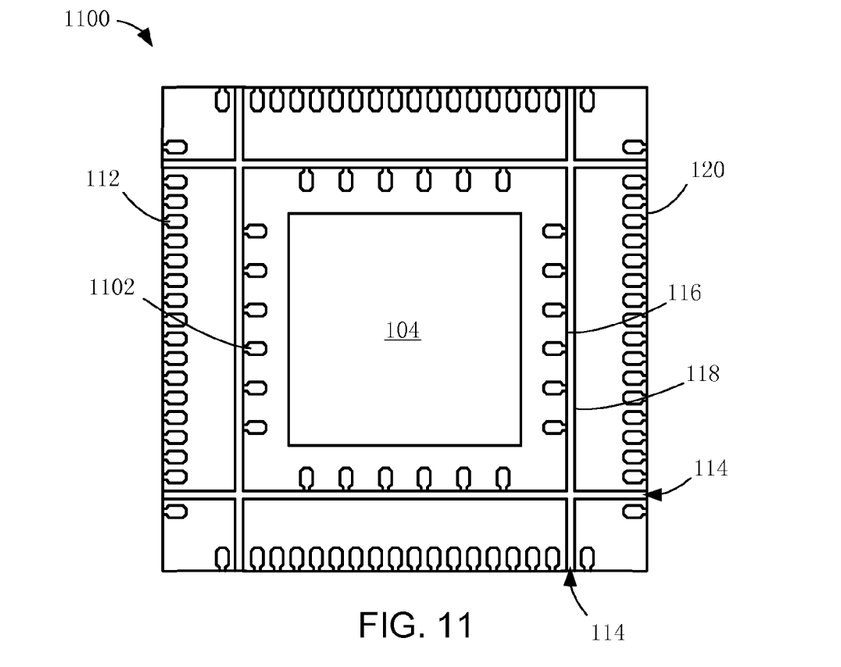
FIG. 11 shows a bottom view of the fifth embodiment of the present invention after a stage of singulation.

Referring now to FIG. 11, therein is shown a bottom view of a finished leadframe 1100 of FIG. 10 after a stage of singulation. The groove 114 is cut to eliminate the inner frame bars 204 and to expose the groove inner surface 116 and the groove outer surface 118 in an encapsulant 1104. The elimination of the inner frame bars 204 electrically isolates the inner leads 1002.

The singulation process eliminates the outer frame bars 202 and exposes the leadframe outer surface 120. The elimination of the outer frame bars 202 electrically isolates the outer leads 112.

Figure 12:
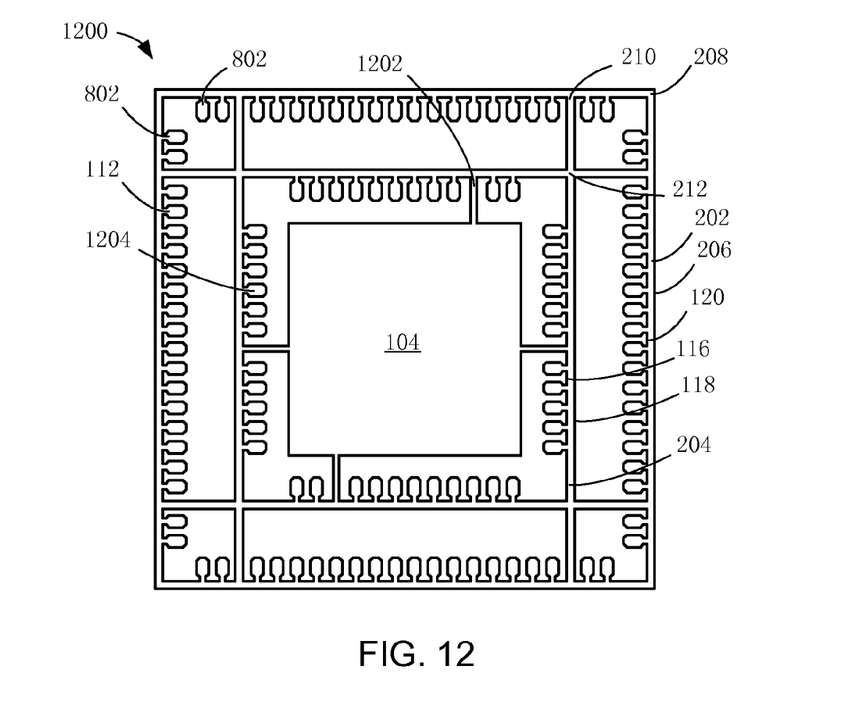
FIG. 12 shows a top view of an unfinished leadframe of a sixth embodiment of the present invention with different tiebar locations at a beginning stage of the process.

Referring now to FIG. 12, therein is shown a top view of an unfinished leadframe 1200 of a sixth embodiment of the present invention in a beginning stage of the process. The unfinished leadframe 1200 has the outer frame bars 202. The unfinished leadframe 1200 also has the inner frame bars 204 located within the opening formed by the outer frame bars 202.

One of the outer frame bars 202 has an inner surface, which will become the leadframe outer surface 120 and also has the outer frame bar outer surface 206. Two of the outer frame bars 202, which are adjacent, join at the outer frame corner 208. One of the inner frame bars 204 intersects with one of the outer frame bars 202 at the intersection point 210.

The inner frame bars 204 are coplanar with and parallel to the outer frame bars 202, respectively. Two of the inner frame bars 204, which are adjacent, intersect at the inner frame corner 212. One of the inner frame bars 204 has an inner surface, which will become the groove inner surface 116 and an outer surface, which will become the groove outer surface 118.

The die pad 104 lies within the opening formed by the inner frame bars 204. An inner tiebar 1202 connects one of the inner frame bars 204 to the die pad 104. The inner tiebar 1202 is half-etched. In this embodiment the inner tiebar 1202 is parallel to one of the inner frame bars 204 and is also parallel to one of the outer frame bars 202. The outer tiebar 214 is absent in this embodiment of the present invention, compared to the first embodiment of the present invention.

The outer leads 112 are attached to the outer frame bars 202. The extra outer lead 802 is also attached to one of the outer frame bars 202 between the outer frame corner 208 and the intersection point 210. Eight extra outer leads are present in this embodiment of the present invention. The extra outer lead 802 is made possible due to the absence of the outer tiebar 214 in this embodiment of the present invention.

Inner leads 1204 are attached to the inner frame bars 204. Due to the presence of the inner tiebar 1202, one of the inner leads 1204 is missing along the inner frame bar 204.

In this embodiment, both the inner leads 1204, the outer leads 112, and the extra outer lead 802 point inward towards the die pad 104 in an encapsulant 1206. In other embodiments, the orientation of the inner leads 1204, the outer leads 112, or the extra outer lead 802 could be pointing outwards.

Figures 13, 14:
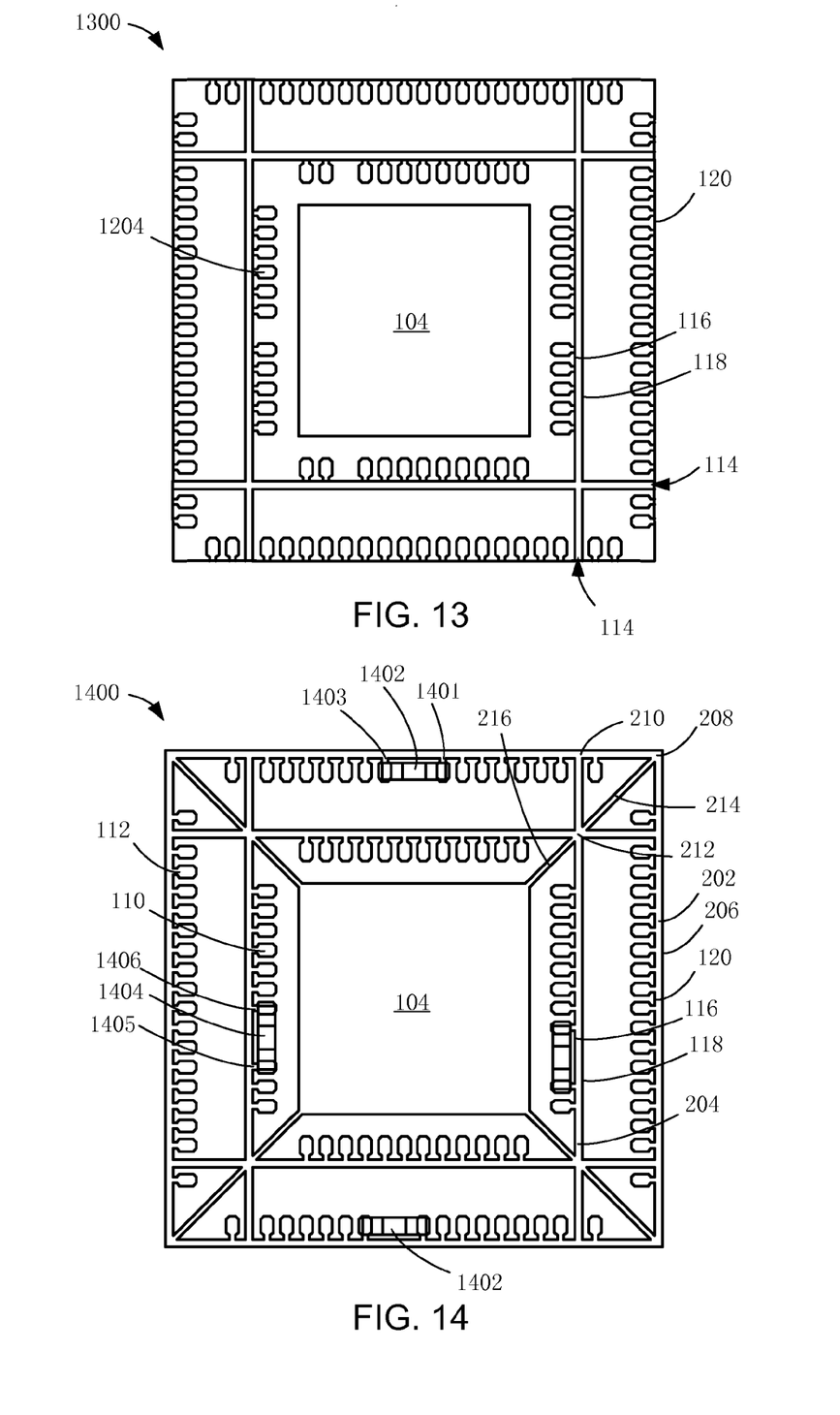
FIG. 13 shows a bottom view of the sixth embodiment of the present invention after a stage of singulation.
FIG. 14 shows a top view of an unfinished leadframe of a seventh embodiment of the present invention with passive devices at a beginning stage of the process.

Referring now to FIG. 13, therein is shown a bottom view of a finished leadframe 1300 of FIG. 12 after a stage of singulation. The groove 114 is cut to eliminate the inner frame bars 204 and to expose the groove inner surface 116 and the groove outer surface 118 in an encapsulant 1302. The elimination of the inner frame bars 204 electrically isolates the inner leads 1204.

The singulation process eliminates the outer frame bars 202 and exposes the leadframe outer surface 120. The elimination of the outer frame bars 202 electrically isolates the outer leads 112 and the extra outer lead 802.

Referring now to FIG. 14, therein is shown a top view of an unfinished leadframe 1400 of a seventh embodiment of the present invention in a beginning stage of the process. The unfinished leadframe 1400 has the outer frame bars 202. The unfinished leadframe 1400 also has the inner frame bars 204 located within the opening formed by the outer frame bars 202.

One of the outer frame bars 202 has an inner surface, which will become the leadframe outer surface 120 and also has the outer frame bar outer surface 206. Two of the outer frame bars 202, which are adjacent, join at the outer frame corner 208. One of the inner frame bars 204 intersects with one of the outer frame bars 202 at the intersection point 210.

The inner frame bars 204 are coplanar with and parallel to the outer frame bars 202, respectively. Two of the inner frame bars 204, which are adjacent, intersect at the inner frame corner 212. One of the inner frame bars 204 has an inner surface, which will become the groove inner surface 116 and an outer surface, which will become the groove outer surface 118.

The outer tiebar 214 connects the outer frame corner 208 and the inner frame corner 212. The outer tiebar 214 is half-etched. The die pad 104 lies within the opening formed by the inner frame bars 204. The inner tiebar 216 connects the inner frame corner 212 to a corner of the die pad 104. The inner tiebar 216 is half-etched.

The outer leads 112 are attached to the outer frame bars 202. The inner leads 110 are attached to the inner frame bars 204.

An outer passive device 1402 is placed between a first outer lead 1401 and a second outer lead 1403. An inner passive device 1404 is placed between a first inner lead 1405 and a second inner lead 1406. A passive device is an electric device of the nature of a resistor, a capacitor, an inductor, or other passive type. The presence of the outer passive device 1402 leads to the absence of a few of the outer leads 112. The presence of the inner passive device 1404 leads to the absence of a few of the inner leads 110.

In this embodiment, both the inner leads 110 and the outer leads 112 point inward towards the die pad 104 in an encapsulant 1408. In other embodiments, the orientation of the inner leads 110 or the outer leads 112 could be pointing outwards.

Figure 15:
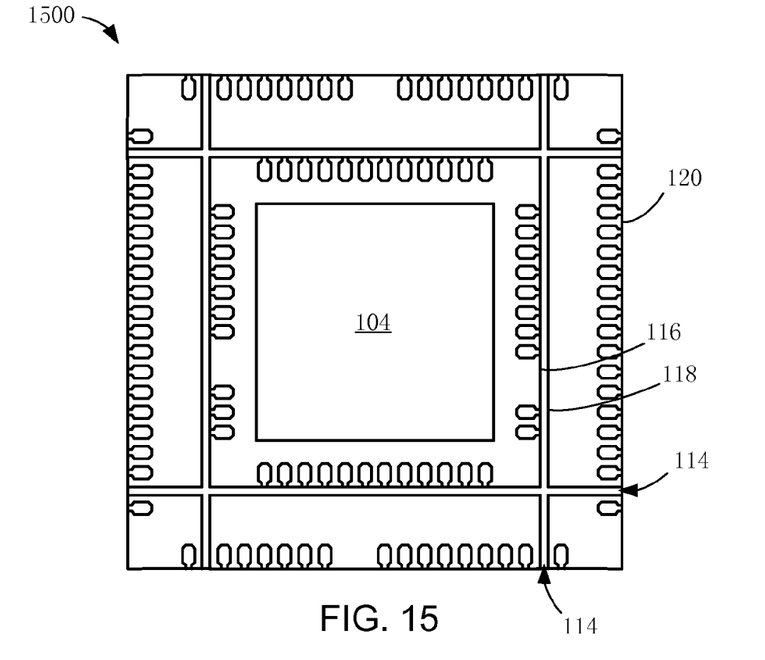
FIG. 15 shows the bottom view of the seventh embodiment of the present invention after a stage of singulation.

Referring now to FIG. 15, therein is shown a bottom view of a finished leadframe 1500 of FIG. 14 after a stage of singulation. The groove 114 is cut to eliminate the inner frame bars 204 and to expose the groove inner surface 116 and the groove outer surface 118 in an encapsulant 1502. The elimination of the inner frame bars 204 electrically isolates the inner leads 110.

The singulation process eliminates the outer frame bars 202 and exposes the leadframe outer surface 120. The elimination of the outer frame bars 202 electrically isolates the outer leads 112.

Figure 16:
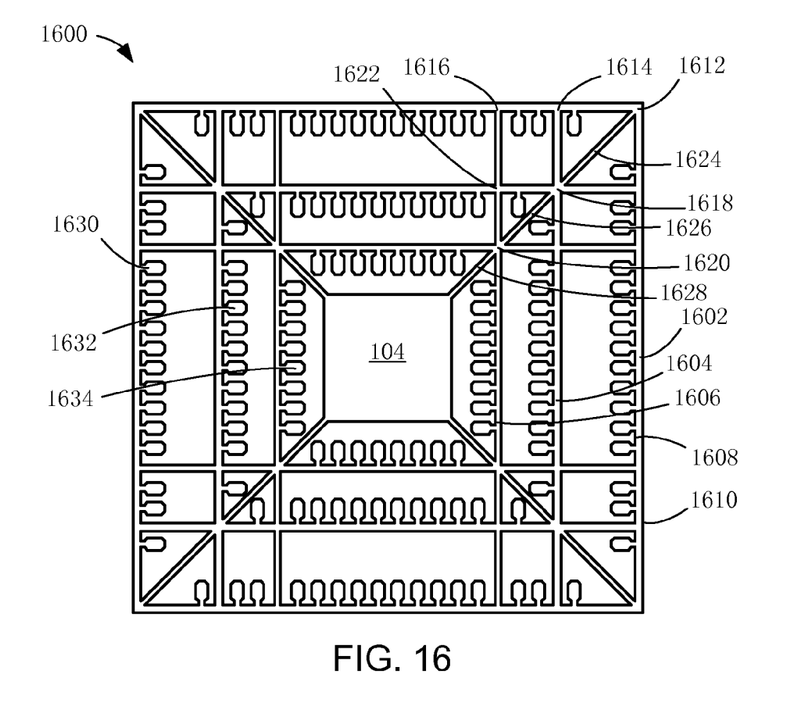
FIG. 16 shows a top view of an unfinished leadframe of an eighth embodiment of the present invention with three rows of leads at a beginning stage of the process.

Referring now to FIG. 16, therein is shown a top view of an unfinished leadframe 1600 of an eighth embodiment of the present invention in a beginning stage of the process.

The unfinished leadframe 1600 has outer frame bars 1602. The unfinished leadframe 1600 also has middle frame bars 1604 located within the opening formed by the outer frame bars 1602. The unfinished leadframe 1600 also has inner frame bars 1606 located within the opening formed by the middle frame bars 1604.

One of the outer frame bars 1602 has an outer frame bar inner surface 1608 and an outer frame bar outer surface 1610.

Two of the outer frame bars 1602, which are adjacent, join at an outer frame corner 1612. One of the middle frame bars 1604 intersects with one of the outer frame bars 1602 at a middle intersection point 1614. One of the inner frame bars 1606 intersects with one of the outer frame bars 1602 at an inner intersection point 1616.

The middle frame bars 1604 are coplanar with and parallel to the outer frame bars 1602, respectively. Two of the middle frame bars 1604, which are adjacent, intersect at a middle frame corner 1618.

The inner frame bars 1606 are coplanar with and parallel to the outer frame bars 1602, respectively. Two of the inner frame bars 1606, which are adjacent, intersect at an inner frame corner 1620. One of the inner frame bars 1606 intersects with one of the middle frame bars 1604 at an intermediate intersection point 1622.

An outer tiebar 1624 connects the outer frame corner 1612 and the middle frame corner 1618. A middle tiebar 1626 connects the middle frame corner 1618 and the inner frame corner 1620. The die pad 104 lies within the opening formed by the inner frame bars 1606. An inner tiebar 1628 connects the inner frame corner 1620 to a corner of the die pad 104. The outer tiebar 1624, the middle tiebar 1626, and the inner tiebar 1628 are half-etched.

Outer leads 1630 are attached to the outer frame bars 1602. Middle leads 1632 are attached to the middle frame bars 1604. Inner leads 1634 are attached to the inner frame bars 1606.

In this embodiment, the inner leads 1634, the middle leads 1632, and the outer leads 1630 point inward towards the die pad 104 in an encapsulant 1636. In other embodiments, the orientation of the inner leads 1634, the middle leads 1632, or the outer leads 1630 could be pointing outwards.

Figure 17:
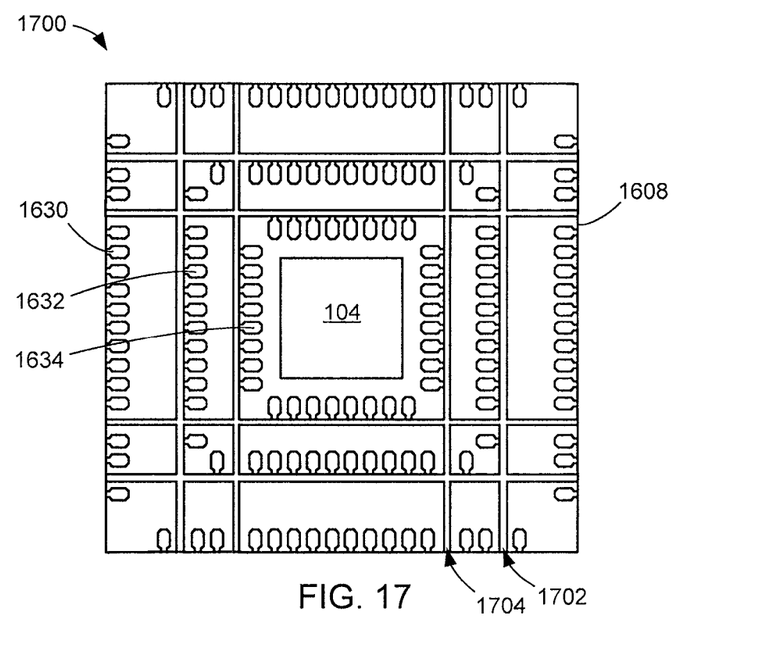
FIG. 17 shows a bottom view of the eighth embodiment of the present invention after a stage of singulation.

Referring now to FIG. 17, therein is shown a bottom view of a finished leadframe 1700 of FIG. 16 after a stage of singulation. Outer grooves 1702 are cut to eliminate the middle frame bars 1604 of FIG. 16 in an encapsulant 1706. The elimination of the middle frame bars 1604 electrically isolates the middle leads 1632. Inner grooves 1704 are cut to eliminate the inner frame bars 1606 of FIG. 16. The elimination of the inner frame bars 1606 electrically isolates the inner leads 1634.

The singulation process eliminates the outer frame bars 1602 of FIG. 16 and exposes the outer frame bar inner surface 1608. The elimination of the outer frame bars 1602 electrically isolates the outer leads 1630.

Figure 18:
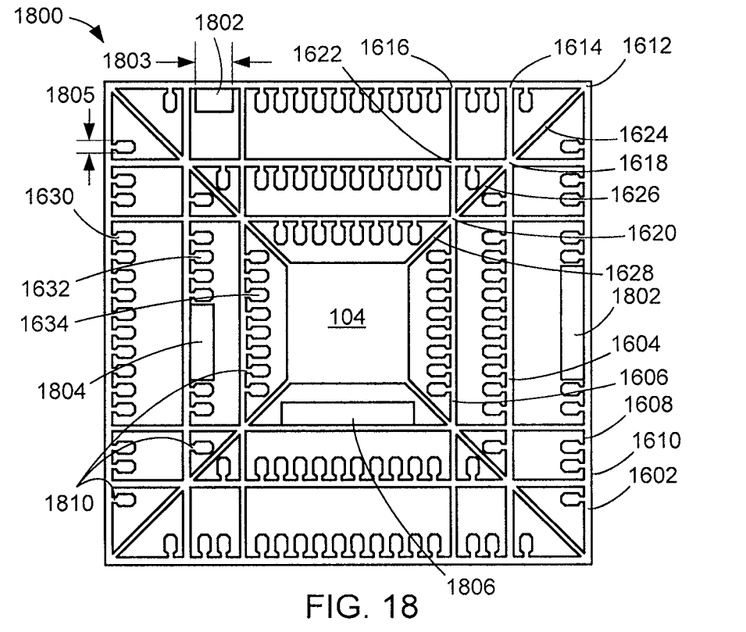
FIG. 18 shows a top view of an unfinished leadframe of a ninth embodiment of the present invention with multiple lead pads at a beginning stage of the process.

Referring now to FIG. 18, therein is shown a top view of an unfinished leadframe 1800 of a ninth embodiment of the present invention in a beginning stage of the process.

The unfinished leadframe 1800 has the outer frame bars 1602. The unfinished leadframe 1800 also has the middle frame bars 1604 located within the opening formed by the outer frame bars 1602. The unfinished leadframe 1800 also has the inner frame bars 1606 located within the opening formed by the middle frame bars 1604.

One of the outer frame bars 1602 has the outer frame bar inner surface 1608 and the outer frame bar outer surface 1610.

Two of the outer frame bars 1602, which are adjacent, join at the outer frame corner 1612. One of the middle frame bars 1604 intersects with one of the outer frame bars 1602 at the middle intersection point 1614. One of the inner frame bars 1606 intersects with one of the outer frame bars 1602 at the inner intersection point 1616.

The middle frame bars 1604 are coplanar with and parallel to the outer frame bars 1602, respectively. Two of the middle frame bars 1604, which are adjacent, intersect at the middle frame corner 1618.

The inner frame bars 1606 are coplanar with and parallel to the outer frame bars 1602, respectively. Two of the inner frame bars 1606, which are adjacent, intersect at the inner frame corner 1620. One of the inner frame bars 1606 intersects with one of the middle frame bars 1604 at the intermediate intersection point 1622.

The outer tiebar 1624 connects the outer frame corner 1612 and the middle frame corner 1618. The middle tiebar 1626 connects the middle frame corner 1618 and the inner frame corner 1620. The die pad 104 lies within the opening formed by the inner frame bars 1606. The inner tiebar 1628 connects the inner frame corner 1620 to a corner of the die pad 104. The outer tiebar 1624, the middle tiebar 1626, and the inner tiebar 1628 are half-etched.

The outer leads 1630 are attached to the outer frame bars 1602. The middle leads 1632 are attached to the middle frame bars 1604. The inner leads 1634 are attached to the inner frame bars 1606.

An outer lead pad 1802 is formed by fusing a few outer leads 1630 together. A row of the outer lead pad 1802 and the outer leads 1630 includes the outer lead pad 1802 adjacent and directly in between the outer leads 1630. The outer lead pad 1802 includes a pad width 1803 greater than a lead width 1805 of each of the outer leads 1630. A middle lead pad 1804 is formed by fusing a few middle leads 1632 together. An inner lead pad 1806 is formed by fusing a few inner leads 1634 together. The various outer lead pads 1802, middle lead pads 1804, and inner lead pads 1806 could serve as source pads, ground pads, etc. for the semiconductor package.

In this embodiment, the inner leads 1634, the middle leads 1632, and the outer leads 1630, which are adjacent to the die pad 104, point inward towards the die pad 104. In other embodiments, the orientation of the inner leads 1634, the middle leads 1632, or the outer leads 1630 could be pointing away from the die pad 104. A connector portion 1810 is between and integral with each of the leads and corresponding bars according to the orientation. The connector portion 1810 is between the inner frame bars 1606 and each of the inner leads 1634, between the middle frame bars 1604 and each of the middle leads 1632, and between the outer frame bars 1602 and each of the outer leads 1630. The connector portion 1810 is integral with only one side of each of the inner leads 1634.

Figure 19:
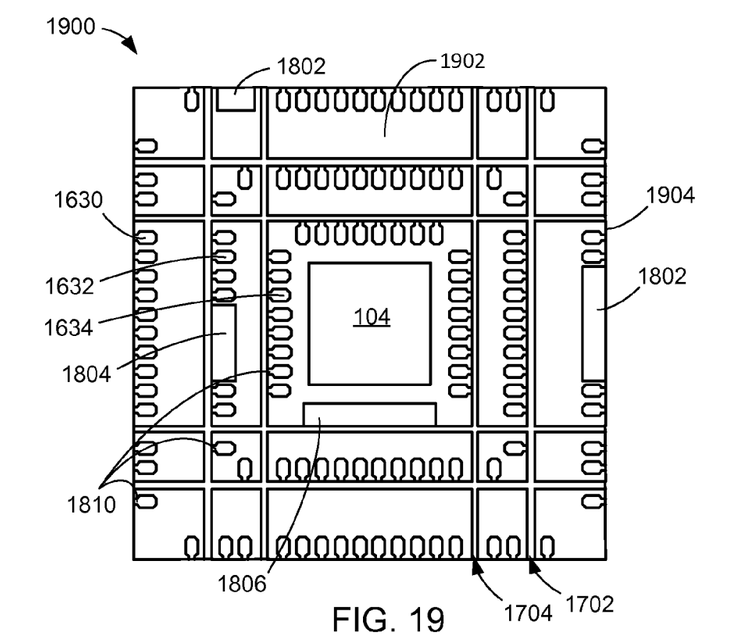
FIG. 19 shows a bottom view of the ninth embodiment of the present invention after a stage of singulation.

Referring now to FIG. 19, therein is shown a bottom view of a finished leadframe 1900, such as a package 1900 including a result of singulation and processing of the unfinished leadframe 1800 of FIG. 18 after a stage of singulation. The outer grooves 1702 are cut abutting instances of the connector portion 1810 along a row of the middle leads 1632 and parallel to each of the abutting rows therein to eliminate the middle frame bars 1604 of FIG. 16 in an encapsulant 1902. The elimination of the middle frame bars 1604 electrically isolates the middle leads 1632 and the middle lead pads 1804. The inner grooves 1704 are cut in the encapsulant 1902 abutting instances of the connector portion 1810 along a row of the inner leads 1634 and parallel to each of the abutting rows therein to eliminate the inner frame bars 1606 of FIG. 16. The inner grooves 1704 are cut in the encapsulant 1902 from edge-to-edge to be perpendicular to and to pass through a row of the outer leads 1630. The elimination of the inner frame bars 1606 electrically isolates the inner leads 1634 and the inner lead pads 1806. The die pad 104, the inner leads 1634, and the inner lead pads 1806 are exposed at the bottom of the encapsulant 1902.

The singulation process eliminates the outer frame bars 1602 of FIG. 16 and exposes a periphery edge 1904 of the encapsulation 1902 previously contacting the outer frame bar inner surface 1608 of FIG. 16. The elimination of the outer frame bars 1602 electrically isolates each of the outer leads 1630 and the outer lead pads 1802 from each other.

Figure 20:
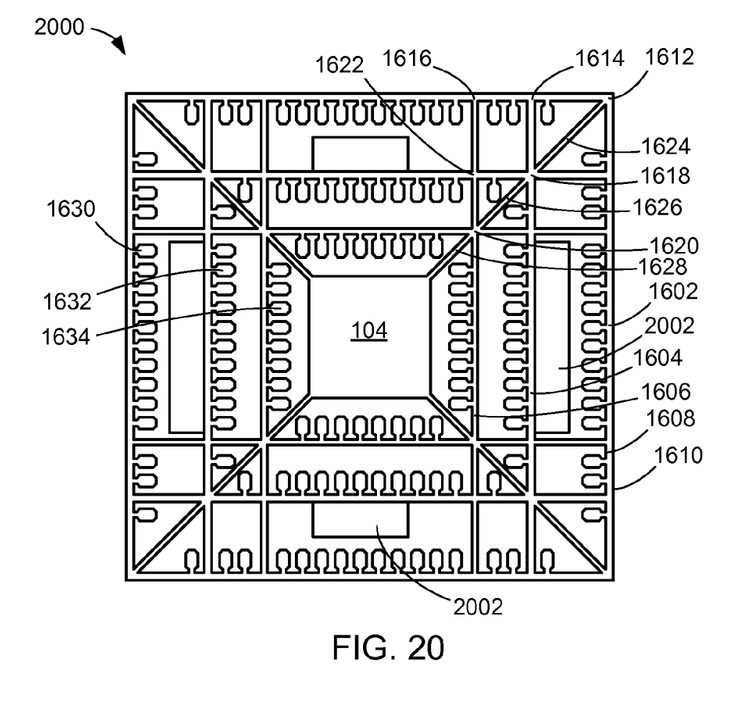
FIG. 20 shows a top view of an unfinished leadframe of a tenth embodiment of the present invention with multiple die pads at a beginning stage of the process.

Referring now to FIG. 20, therein is shown a top view of an unfinished leadframe 2000 of a tenth embodiment of the present invention in a beginning stage of the process.

The unfinished leadframe 2000 has the outer frame bars 1602. The unfinished leadframe 2000 also has the middle frame bars 1604 located within the opening formed by the outer frame bars 1602. The unfinished leadframe 2000 also has the inner frame bars 1606 located within the opening formed by the middle frame bars 1604.

One of the outer frame bars 1602 has the outer frame bar inner surface 1608 and the outer frame bar outer surface 1610.

Two of the outer frame bars 1602, which are adjacent, join at the outer frame corner 1612. One of the middle frame bars 1604 intersects with one of the outer frame bars 1602 at the middle intersection point 1614. One of the inner frame bars 1606 intersects with one of the outer frame bars 1602 at the inner intersection point 1616.

The middle frame bars 1604 are coplanar with and parallel to the outer frame bars 1602, respectively. Two of the middle frame bars 1604, which are adjacent, intersect at the middle frame corner 1618.

The inner frame bars 1606 are coplanar with and parallel to the outer frame bars 1602, respectively. Two of the inner frame bars 1606, which are adjacent, intersect at the inner frame corner 1620. One of the inner frame bars 1606 intersects with one of the middle frame bars 1604 at the intermediate intersection point 1622.

The outer tiebar 1624 connects the outer frame corner 1612 and the middle frame corner 1618. The middle tiebar 1626 connects the middle frame corner 1618 and the inner frame corner 1620. The die pad 104 lies within the opening formed by the inner frame bars 1606. The inner tiebar 1628 connects the inner frame corner 1620 to a corner of the die pad 104. The outer tiebar 1624, the middle tiebar 1626, and the inner tiebar 1628 are half-etched.

The outer leads 1630 are attached to the outer frame bars 1602. The middle leads 1632 are attached to the middle frame bars 1604. The inner leads 1634 are attached to the inner frame bars 1606.

Additional die pads 2002 are attached to the middle frame bars 1604. The additional die pads 2002 are in opposite positions to the middle leads 1632 along the middle frame bars 1604. The additional die pads 2002 could accommodate additional semiconductor chips within this single semiconductor package.

In this embodiment, the inner leads 1634, the middle leads 1632, and the outer leads 1630 point inward towards the die pad 104 in an encapsulant 2004. In other embodiments, the orientation of the inner leads 1634, the middle leads 1632, or the outer leads 1630 could be pointing outwards.

Figure 21:
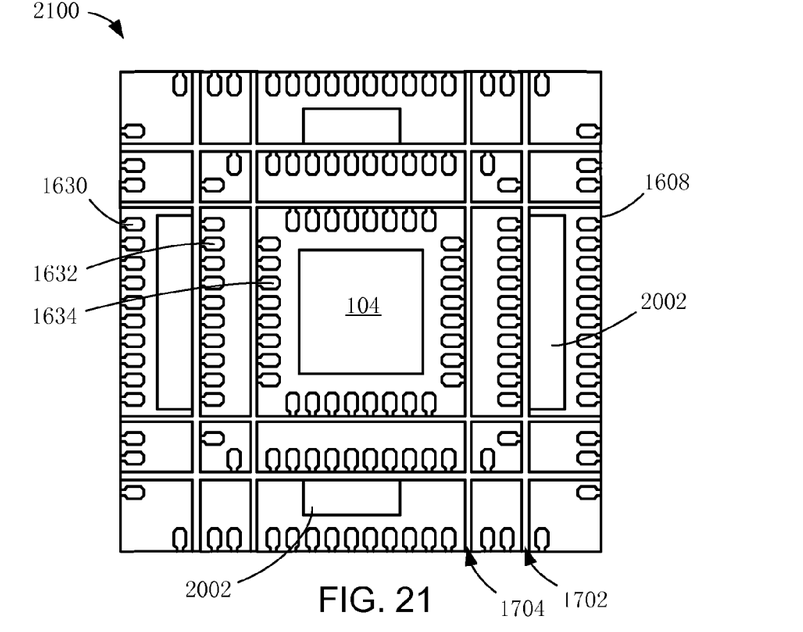
FIG. 21 shows the bottom view of the tenth embodiment of the present invention after a stage of singulation.

Referring now to FIG. 21, therein is shown a bottom view of a finished leadframe 2100 of FIG. 20 after a stage of singulation. The outer grooves 1702 are cut to eliminate the middle frame bars 1604 of FIG. 16 in an encapsulant 2102. The elimination of the middle frame bars 1604 electrically isolates the middle leads 1632 and the additional die pads 2002. The inner grooves 1704 are cut to eliminate the inner frame bars 1606 of FIG. 16. The elimination of the inner frame bars 1606 electrically isolates the inner leads 1634.

The singulation process eliminates the outer frame bars 1602 of FIG. 16 and exposes the outer frame bar inner surface 1608. The elimination of the outer frame bars 1602 electrically isolates the outer leads 1630.

It has been unexpectedly discovered that the embodiment of the present invention could solve the long existing problem associated with the nonplanar nature of the integrated circuit package. In a prior art integrated circuit package system, the die pad is usually downset to make it non-coplanar with the rest of the leadframe. This practice makes it difficult to cut the leadframe efficiently and will result in accidental destruction of the integrated circuit package and the semiconductor chips mounted on it. The embodiment of the present invention accommodates the co-planar structure and thus eliminates a host of problems associated with the non-coplanar structure.

Figure 22:
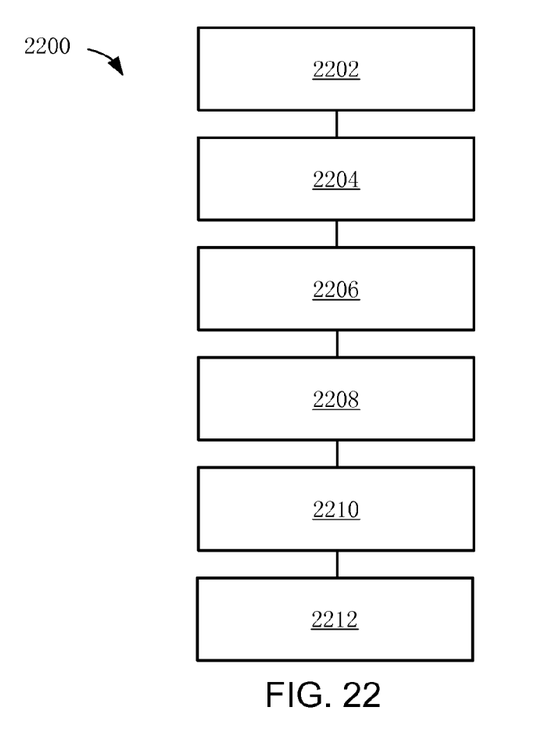
FIG. 22 is a flow chart of a method for manufacturing the semiconductor package system in an embodiment of the present invention.

Referring now to FIG. 22, therein is shown a flow chart of a method 2200 for manufacturing the semiconductor package system 100 in an embodiment of the present invention. The method 2200 includes providing a leadframe having inner frame bars, outer frame bars, a die pad, tiebars, and rows of leads, the inner frame bars being coplanar with the outer frame bars in a block 2202; attaching a semiconductor chip to the die pad in a block 2204; attaching bond wires between the semiconductor chip and the rows of leads in a block 2206; encapsulating the semiconductor chip, the bond wires, the inner frame bars, the outer frame bars, the die pad, the tiebars, and the rows of leads in an encapsulant in a block 2208; cutting grooves to remove the inner frame bars in a block 2210; and singulating the leadframe and the encapsulant to remove the outer frame bars in a block 2212.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improving yield, increasing reliability, reducing complexity, and reducing cost of integrated circuit system. The resulting processes and configurations are straightforward, cost-effective, uncomplicated, highly versatile and effective, can be surprisingly and unobviously implemented by adapting known technologies, and are thus readily suited for efficiently and economically manufacturing integrated circuit package system fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of a semiconductor package system comprising:
   providing a leadframe having an inner frame bar, an outer frame bar, a die pad, tiebars, and rows of leads including inner leads, outer leads, and an outer lead pad adjacent the outer leads with the inner frame bar and the outer frame bar integrally connected to the rows of leads and the inner frame bar coplanar with the outer frame bar, wherein the outer leads and the outer lead pad are in one of the rows of leads, the outer lead pad is directly in between the outer leads, the outer lead pad is formed by fusing a few of the outer leads together, and the outer lead pad having a pad width greater than a lead width of each of the outer leads;
   attaching a semiconductor chip to the die pad;
   attaching bond wires between the semiconductor chip and the rows of leads;
   encapsulating the semiconductor chip, the bond wires, the inner frame bar, the outer frame bar, the die pad, the tiebars, and the rows of leads in an encapsulant;
   cutting a groove in the encapsulant along a row of the inner leads to remove the inner frame bar, the groove in the encapsulant perpendicular to and passing through a row of the outer leads, the outer leads have outer lead inner surfaces fully embedded in the encapsulant, the outer lead inner surfaces have an inner surface height the same as a lead height of the outer leads and the inner leads, the inner leads have inner lead outer surfaces fully exposed in the groove, the inner lead outer surfaces have an outer surface height the same as the lead height, the groove has a groove depth equal to the lead height, the groove is directly in between the outer lead inner surfaces and the inner lead outer surfaces; and
   singulating the leadframe and the encapsulant to remove the outer frame bar.

2. The method as claimed in claim 1 wherein providing the leadframe includes providing more than two of the rows of leads.

3. The method as claimed in claim 1 wherein providing the leadframe includes providing multiple lead pads.

4. A semiconductor package system comprising:
   a die pad;
   rows of leads adjacent to the die pad, with the rows of leads being coplanar, the rows of leads including inner leads, outer leads, and an outer lead pad adjacent the outer leads, wherein the outer leads and the outer lead pad are in one of the rows of leads, the outer lead pad is directly in between the outer leads, the outer lead pad is formed by fusing a few of the outer leads together, and the outer lead pad having a pad width greater than a lead width of each of the outer leads;
   a semiconductor chip attached to the die pad;
   bond wires connected to the semiconductor chip and the rows of leads; and
   an encapsulant over the semiconductor chip, the bond wires, the die pad, and the rows of leads, the encapsulant having a groove cut therein along a row of the inner leads for isolating the inner leads, the groove in the encapsulant perpendicular to and passing through a row of the outer leads, the outer leads have outer lead inner surfaces fully embedded in the encapsulant, the outer lead inner surfaces have an inner surface height the same as a lead height of the outer leads and the inner leads, the inner leads have inner lead outer surfaces fully exposed in the groove, the inner lead outer surfaces have an outer surface height the same as the lead height, the groove has a groove depth equal to the lead height, the groove is directly in between the outer lead inner surfaces and the inner lead outer surfaces.

5. The system as claimed in claim 4 wherein the rows of leads include more than two of the rows of leads.

6. The system as claimed in claim 4 wherein the rows of leads include multiple lead pads.

* * * * *